United States Patent [19]

Higashigaki et al.

[11] Patent Number: 5,316,858
[45] Date of Patent: May 31, 1994

[54] MATERIALS FOR THERMOELECTRIC AND LIGHT-HEAT CONVERSION

[75] Inventors: Yoshiyuki Higashigaki, Kashiwa; Yoshikazu Yoshimoto, Tenri; Tomonari Suzuki, Kashihara; Shigeo Nakajima, Nara; Toshio Inoguchi, Kashihara, all of Japan

[73] Assignee: Sharp Kabushiki Kaisha, Osaka, Japan

[21] Appl. No.: 921,609

[22] Filed: Aug. 3, 1992

Related U.S. Application Data

[60] Continuation of Ser. No. 656,551, Feb. 19, 1991, abandoned, which is a continuation-in-part of Ser. No. 428,000, Oct. 30, 1989, abandoned, which is a continuation of Ser. No. 100,309, Sep. 23, 1987, abandoned, which is a division of Ser. No. 841,829, Mar. 20, 1986, Pat. No. 4,714,639.

[30] Foreign Application Priority Data

Mar. 22, 1985 [JP] Japan .................................. 60-59276
Mar. 26, 1985 [JP] Japan .................................. 60-64571

[51] Int. Cl.[5] .............................................. B32B 15/04
[52] U.S. Cl. ..................................... 428/457; 428/212; 428/408; 428/704; 428/913; 423/445; 423/447.5; 252/502; 252/503; 252/512; 252/518; 136/239; 136/240
[58] Field of Search ...................... 423/445, 448, 447.5, 423/460, 447.2, 447.1, 439; 428/913, 34.1, 34.4, 408, 34.6, 212, 36.9, 409, 35.91, 457, 704; 252/502, 503, 506, 507, 518, 512; 204/173; 260/665 R; 136/239, 240, 236.1; 427/74, 249

[56] References Cited

U.S. PATENT DOCUMENTS

| 2,946,835 | 7/1980 | Westbrook et al. | 136/5 |
| 3,330,703 | 7/1967 | Podolsky | 136/239 |
| 3,434,888 | 3/1969 | Beaver, Jr. | 136/203 |
| 4,388,227 | 6/1983 | Kalnin | 252/510 |
| 4,465,895 | 8/1984 | Verner et al. | 136/225 |
| 4,701,317 | 10/1987 | Arakawa et al. | 423/445 |

FOREIGN PATENT DOCUMENTS

901177 11/1959 United Kingdom.

OTHER PUBLICATIONS

G. M. Barrow, "Physical Chemistry", 2nd Edition (1966), pp. 316–319.
M. Inagaki, "Carbon Materials Engineering", (1985), pp. 1–7.
S. Otani, Y. Sanada, "Basic Carbonization Engineering", (1982), pp. 10–13.
H. Mikawa, "Outline of Chemistry; Charge-Transfer Complexes", 1st vol., (1975), pp. 189–190.

Primary Examiner—Donald J. Loney
Attorney, Agent, or Firm—Birch, Stewart, Kolasch & Birch

[57] ABSTRACT

The disclosure is directed to a method for converting between heat energy and electric energy which is characterized in that a carbon intercalation compound is employed as a thermoelectric material by utilizing a temperature difference in a direction perpendicular to the structure of carbon layers, or a method for producing a light-heat converting material which is characterized in that a thin metallic layer like a translucent mirror is caused to adhere to the inner surface of a light transmissive hollow tube by pyrolytically decomposing at a temperature approximately below 1000° C., with hydrocarbons being introduced into the hollow tube at the rate of a predetermined amount per hour.

3 Claims, 1 Drawing Sheet

MATERIALS FOR THERMOELECTRIC AND LIGHT-HEAT CONVERSION

This application is a continuation of application Ser. No. 07/656,551 filed on Feb. 19, 1991, now abandoned, which is a continuation-in-part of Ser. No. 07/428,000 filed Oct. 30, 1989 now abandoned, which is a continuation of application Ser. No. 07/100,309 filed Sep. 23, 1987 now abandoned, which is a divisional of application Ser. No. 06/841,829 filed on Mar. 20, 1986 now U.S. Pat. No. 4,714,639.

BACKGROUND OF THE INVENTION

The present invention relates to a method for converting a certain type of energy to a different type of energy. For example, a method for generating electric energy from a temperature difference and vice versa or a method for converting light energy into heat energy. More particularly, the present invention relates to a method for converting between heat energy and electric energy by employing a carbon intercalation compound as a thermoelectric material, and employing a light-heat converting material to heat a fluid flowing in a hollow tube, wherein a thin carbon layer having metallic luster is accumulated on the inner surface thereof. The present invention also relates to a method for producing such thermoelectric material as well as a method for producing such a light-heat converting material.

It is well known that a figure of merit Z is the value for a thermoelectric performance representing a conversion efficiency between heat energy and electric energy. Z-value is estimated by a formula, $Z=\alpha^2/\rho\kappa$, where $\alpha$ is a Seebeck coefficient or a thermoelectric power ($\mu VK^{-1}$), $\rho$ is an electrical resistivity ($\Omega cm$) and $\kappa$ is a thermal conductivity ($Wcm^{-1}K^{-1}$). Accordingly, it is obvious that a large $\alpha$, a small $\rho$ and a small $\kappa$ are required for obtaining a large figure of merit Z. On the other hand, in addition to the above conditions, the thermoelectric material is required to have a reliable PN controllability of its own. Furthermore, when used as a thermoelectric generator, the material is required to be operable at high temperatures so as to achieve high thermodynamic efficiency, or when used as a thermoelectric refrigerator, the material is required to realize PN-junction with high heat insulating properties.

Conventionally, various compounds, such as single-crystalline silicon semiconductor, bismuth or antimony chalcogenides, polycrystalline transition-metal silicides, amorphous bismuth chalcogenides or the like, are known as typical thermoelectric materials. However, among graphite intercalation compounds, only one has been found to be used as a thermoelectric material and the material is carbon fiber. Carbon fiber is used as a thermoelectric generator utilizing a temperature difference in the axial direction of fibers wherein an alkali metal or bromine is inserted between carbon layers of carbon fiber. There have been, however, two drawbacks in this practice. The first drawback is that, since the axial direction of fibers is parallel to the in-plane direction of a graphite structure, not only the electrical conductivity but also the thermal conductivity is large. Accordingly, inexhaustible high and low heat sources are required for thermoelectric generation, and this results in limited utilization for such a type of thermoelectric material. The second drawback is that, since alkali metal (potassium) or halogen (bromine) which have high reactivity, is employed as the intercalant for the graphite intercalation compound, the thermoelectric material is easily deteriorated by moisture or by oxygen in the air.

Subsequently, in regards to the light-heat converting material, it is well known that upon collection of radiant light by a metal reflected plate or a fluid, such as, water or Freon (trade name) gas in a glass tube which is arranged at a position where light is collected, and each is heated. It is more effective to provide the light-heat converting material on the inner surface of the glass tube which comes in contact with the fluid, than on the outer surface thereof, for effectively converting collected light to heat. A soot-like carbon material can be employed for the light-heat converting material in this case, because carbon is superior in light-heat conversion performance and is chemically and thermally stable. Furthermore, carbon has an extremely large thermal conductivity as compared with glass. There has been, however, a drawback in that the soot-like carbon deposit tends to be peeled from the glass tube due to the mechanical friction between the carbon deposit and the fluid flowing in the tube and as a result, it has not been practical to use.

SUMMARY OF THE INVENTION

Accordingly, an object of the present invention is to provide a highly effective method utilizing the anisotropy of the carbon intercalation compound, for converting between heat energy and electric energy whereby electric energy can be generated from a temperature difference in a direction perpendicular to graphite layers, or the temperature difference in a direction perpendicular to the layers can be generated from electric energy.

Another important object of the present invention is to provide a light-heat converting material for effectively heating a fluid flowing in a hollow tube by providing a thin carbon layer like a translucent mirror on the inner surface thereof.

In accomplishing these and other objects, according to one preferred embodiment of the present invention, there is provided a method for converting between heat energy and electric energy which is characterized in that a carbon intercalation compound is employed as a thermoelectric material by utilizing temperature difference in a direction perpendicular to the carbon layers, or a method for producing a light-heat converting material which is characterized in that a thin metallic film like a translucent mirror is caused to adhere firmly to the inner surface of a light transmissive hollow tube by pyrolytically decomposing hydrocarbons introduced into the hollow tube at the rate of a predetermined amount an hour at a temperature approximately below 1000° C.

BRIEF DESCRIPTION OF THE DRAWINGS

These and other objects and features of the present invention will become apparent from the following description taken in conjunction with the preferred embodiment thereof with reference to the accompanying drawings, in which.

DETAILED DESCRIPTION OF THE INVENTION

Figure 1:
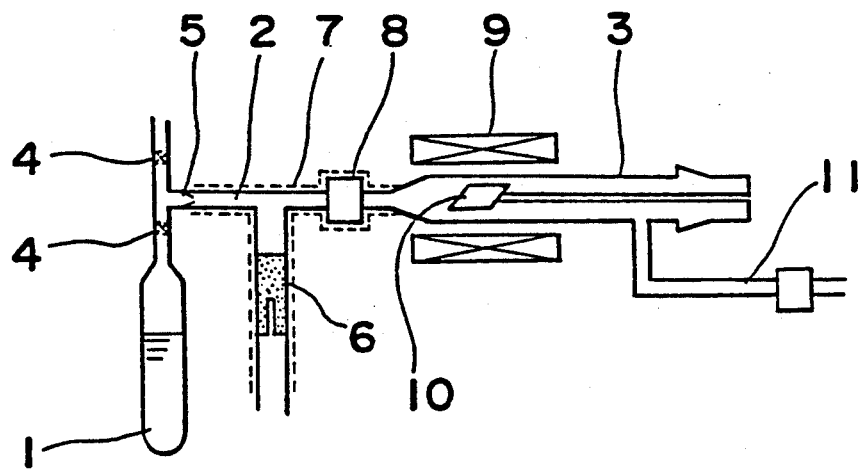
FIG. 1 is a block diagram of an apparatus for producing a carbon intercalation compound, which is employed for producing a thermoelectric material according to one preferred embodiment of the present invention.

Before the description of the present invention proceeds, it is to be noted that like parts are designated by like reference numerals throughout the accompanying drawings.

Semiconductor or semi-metal is generally employed because of easiness of PN control as the thermoelectric material. For example, although a silicon semiconductor is readily PN-controlled, it has a thermal conductivity approximately a quarter of that of copper at room temperature and it seems difficult to improve this value. Furthermore, it is impossible in principle to alter the thermal conductivity and the electrical conductivity independently due to cubic symmetry of the above described semiconductor. On the contrary, the GIC (graphite intercalation compound) can be of the p-type or n-type by arranging a donor or an acceptor type intercalant between carbon layers and it is capable of obtaining the thermoelectric material wherein the electrical conductivity and the thermal conductivity can be altered independently to some extent. So far, various types of intercalants are known and various kinds of graphite intercalation compounds have been produced. However, since each of such kinds of intercalant layers is bound between the graphite layers by a weak bonding force (van der Waals force or charge transfer force), it tends to easily get free from between the carbon layers in air or in moisture. In order to materialize the thermoelectric material which is characterized by the anisotropy peculiar to graphite intercalation compound, it is necessary to interrupt the movement of the intercalant for fixation thereof. This can be realized by the carbon intercalation compound. In the carbon intercalation compound, carbon atoms having $SP^3$-bond are scattered among a great majority of carbon atoms having $SP^2$-bond to maintain the graphite structure and act to fix the intercalants which are intercalated at the same time when the carbon structure is formed.

In the next place, the performance index number of the thermoelectric material employing the carbon intercalation compound will be explained in detail hereinafter.

Upon comparative examination of a variety of thermoelectric materials, it is conjectured that an electrical resistivity thereof is adequate to be $10^{-3}$ $\Omega$cm. Graphite has both of a resistivity component ($\rho_{11}$) parallel to the layers and that ($\rho\bot$) perpendicular thereto, and $\rho_{11} = 5 \times 10^{-5}$ $\Omega$cm and $\rho\bot = 0.5$ $\Omega$cm. It is well known that the resistivity can be lowered by more than one figure through intercalation. On the other hand, in carbon intercalation compound, the electrical anisotropy is adequately lowered by a small amount of carbon atoms having $SP^3$-bond and as a result, the resistivity of $10^{-3}$ $\Omega$cm can be easily obtained.

At around room temperature, an artificial graphite has thermal conductivities, $\kappa_{11} = 0.8$ Wcm$^{-1}$K$^{-1}$ and $\kappa\bot = 2 \times 10^{-2}$ Wcm$^{-1}$K$^{-1}$. When the intercalants are introduced between the layers of host graphite, it has been reported that $\kappa\bot$ can be lowered by $10^{-2}$ to $10^{-3}$ times. Accordingly, in the carbon intercalation compound, the thermoelectric material having thermal conductivity in the range of $10^{-2}$ to $10^{-4}$ Wcm$^{-1}$K$^{-1}$ can be obtained. Furthermore, the thermoelectric material having lowered thermal conductivity below $10^{-3}$ Wcm$^{-1}$K$^{-1}$ can be easily obtained by choosing a heavy metal as an intercalant. Thus, upon utilization of the anisotropy of the carbon intercalation compound, the thermoelectric material having the electrical resistivity $\rho = 10^{-3}$ $\Omega$cm and thermal conductivity $\kappa = 10^{-3}$ Wcm$^{-1}$K$^{-1}$ can be materialized by adjusting the kind and/or the concentration of the intercalant and an existing ratio of carbons having $SP^3$-bond relative to those having $SP^2$-bond.

Subsequently, since the thermoelectric power is a significant physical quantity for the thermoelectric material, it will be described hereinafter.

The coefficient graphite shows such an extremely small thermoelectric power as 5 $\mu$VK$^{-1}$ at room temperature, with respect to the temperature difference in the graphite layers. It is, however, well known that when antimony pentachloride is intercalated to the extent far below a saturated value (10th-stage), the thermoelectric power thereof is increased to 40 $\mu$VK$^{-1}$. Furthermore, it has been reported in case of organic charge-transfer complexes that charge-transfer force is a driving force which causes a large thermoelectric power and the value of thermoelectric power is concretely shown by several mVK$^{-1}$.

Hereupon, when the carbon intercalation compound having $\alpha = 10^{-3}$VK$^{-1}$, $\rho = 10^{-3}$ $\Omega$cm and $\kappa = 10^{-3}$ Wcm$^{-1}$K$^{-1}$ is employed for the thermoelectric material, the thermoelectric material having $Z = 1$K$^{-1}$ can be obtained and this value is 100 to 1000 times larger than the conventional Z-value.

In the next place, a method for producing the above described thermoelectric material will be explained hereinafter.

Since graphite is a semi-metal having approximately the same number of electron carriers and hole carriers, if atoms or compounds having electron donating characteristic or electron accepting characteristic can be intercalated into this semi-metal, N-type or P-type electrical conductive material can be materialized. The intercalant layer has a staged structure alternating with the graphite layers.

The carbon intercalation compounds can be bulk-produced with reliable reproducibility by introducing at a same time atoms or compounds to be intercalated in the process wherein carbon deposit having metallic luster is elaborated by employing a CVD method for hydrocarbons.

FIG. 1 shows an apparatus for producing the carbon intercalation compound, which is employed to produce the thermoelectric material according to one preferred embodiment of the present invention.

A hydrocarbon compound such as aliphatic hydrocarbons, or more preferably aromatic hydrocarbons can be used as starting materials and these kinds of hydrocarbons are pyrolytically decomposed at approximately 1000° C. Concretely, such a hydrocarbon can be used as cyclohexane, n-hexane, benzene, biphenyl, anthracene, hexamethylbenzene, 1,2-dibromoethylene, 2-butyne, acetylene diphenylacetylene or the like. Depending upon the kind of hydrocarbon to be used, one of a bubbling method, an evaporation method, a sublimation method or the like method can be employed as a supplying method into a reaction tube which is later explained in detail, and the supply rate is controlled to be constant below several millimols an hour. This constant value considerably depends upon the kind of the starting material. When the supply rate exceeds the predetermined constant value, the carbon deposit obtained has a fairly uneven surface which results in the production of soot-like carbon deposit.

Silicon, sapphire, silicon carbide (α-type and β-type), boron nitride, kish graphite, highly orientated graphite or the like is used as a single-crystalline substrate on which the thin carbon film is formed and the single-crystalline substrate is required to satisfy conditions in which its property is not changed at the reaction temperature of approximately 1000° C.

In FIG. 1, benzene is selected as a starting material and the evaporating method is employed for producing the thermoelectric material.

Vapor of benzene molecules is led to a quartz reaction tube 3 through a pyrex glass tube 2 from a raw material receptacle 1 wherein benzene purified through vacuum distillation is accommodated. Upon operation of cocks 4, benzene-molecules vaporized from the raw material receptacle 1 is supplied to the glass tube 2 and the amount thereof to be supplied is determined by means of a glass capillary 5 arranged on the glass tube 2. Furthermore, an organometal reagent comprising heavy metal accommodated in a chamber 6 is mixed with benzene molecules in the course of the glass tube 2 so as to be simultaneously fed into the reaction tube 3 together therewith. The glass tube 2 covered with a heating tape 7 so as to be kept at its desired temperature and is connected with the reaction tube 3 through a pyrex-quartz conversion joint. The reaction tube 3 is inserted into a heating furnace 9 so as to be heated up to the reaction temperature and a substrate holder 10 is disposed in the reaction tube 3 for placing a single-crystalline substrate thereon, which enables the carbon deposit to grow up. The remaining vapor led to the reaction tube 3 is discharged outside through a discharge pipe 11.

Inside of the reaction tube 3 is kept at a temperature of approximately 1000° C. by the heating furnace and thereafter, benzene molecules which are controlled in the supply rate thereof by the capillary 5 and the molecules of the organometal comprising heavy metal are supplied to the reaction tube 3 by a constant amount at the rate of several millimols in total an hour. Benzene molecules led into the reaction tube 3 are pyrolytically decomposed at the above described temperature and the carbon deposit having metallic luster are formed on the single-crystalline substrate. At this moment, since the organometal comprising heavy metal is also pyrolytically decomposed and heavy metal atoms are intercalated between the layers of carbon deposit, the carbon deposit obtained is the carbon intercalation material. The carbon intercalation compound produced is a thin layer which has received a desirable crystallization under the influence of the single-crystalline substrate and is highly orientated at a lowered temperature as compared with that of conventional case. In addition, benzene molecules led into the reaction tube 3 and the organometal molecules are controlled at a constant amount, and the carbon deposit produced on the single-crystalline substrate is even in thickness and accordingly, the carbon deposit having an improved crystallization can be obtained, with the surface thereof having metallic luster.

The following carbon intercalation compounds, intercalated between carbon layers with the specific heavy metals chosen from Groups II b (Hg), IV b (Sn, Pb) and V b (Sb, Bi), are prepared as follows:

(1) Carbon intercalation compound intercalated with tin between carbon layers

Production (raw material: benzene and tetraphenyl tin)

Benzene is pyrolytically decomposed into carbon atoms, which accumulate as graphite whereas tetraphenyl tin is pyrolytically decomposed into tin atoms, which are intercalated into graphite layers.

Upon refinement through vacuum distillation, benzene is initially accommodated in a raw material receptacle 1. Upon operation of cocks 4, benzene molecules vaporized from the raw material receptacle 1 are led to a pyrex glass tube 2 and to a quartz reaction tube 3. The amount of benzene molecules to be supplied is controlled by a glass capillary 5 disposed inside the glass tube 2. The glass tube 2 is connected to a chamber 6, in which tetraphenyl tin is accommodated. Accordingly, the benzene molecules and the tetraphenyl tin are mixed with each other in the glass tube 2 and supplied to the reaction tube 3. Both the glass tube 2 and the chamber 6 are covered with and protected by a heating tape 7 and the tetraphenyl tin accommodated therein is vaporized by heating them up to a temperature of 300° C. The glass tube 2 and the reaction tube 3 are connected with each other via a pyrex-quartz conversion joint 8. The reaction tube 3 is inserted into a heating furnace 9 so as to be heated up to the reaction temperature. A substrate holder 10 is disposed inside the reaction tube 3 and a single-crystalline substrate for making the carbon deposit grow up is placed on the substrate holder 10. The remaining vapor led to the reaction tube 3 is discharged outside through a discharge pipe 11.

Upon operation of the heating furnace 9, the inside of the reaction tube 3 is kept at a temperature of 1000° C. Benzene molecules, the amount of supply of which is controlled by the capillary 5, and tetraphenyl tin molecules are led into the reaction tube 3 at a constant rate below several millimols in total per an hour. The benzene molecules led into the reaction tube 3 are pyrolytically decomposed and the carbon deposit having metallic luster are formed on the single-crystalline substrate. In this event, the tetraphenyl tin is also pyrolytically decomposed and tin atoms produced are intercalated between carbon deposit layers during the growing process of the carbon deposit. The carbon deposit obtained in this way is a carbon intercalation compound intercalated with tin atoms between carbon layers.

Evaluation

The thermoelectric power of the carbon intercalation compound in the direction perpendicular to the carbon layers was $\alpha = 60 \, \mu VK^{-1}$. This value is greater than the maximum value up to this time, which was $\alpha = 40 \, \mu VK^{-1}$ and was a value of a graphite intercalation compound obtained by intercalating antimony pentachloride ($SbCl_5$) molecules.

The conductivity ($\sigma$) and the thermal conductivity ($\kappa$) were ($\sigma = 1200 \, \Omega^{-1} cm^{-1}$ and $\kappa = 1.5 \times 10^{-2} Wcm^{-1} K^{-1}$, respectively.

Substantially the same results were obtained by using tetramethyl tin, tetraethyl tin, tetra-n-butyl tin, tin tetrachloride, etc., as well as tetraphenyl tin, as an organometallic compound of tin, which is used as a raw material for forming a carbon intercalation compound intercalated with tin between carbon layers.

(2) Carbon intercalation compound intercalated with lead between carbon layers Production (raw material: benzene and tetraphenyl lead)

Benzene is pyrolytically decomposed into carbon atoms, which accumulate as graphite whereas tetraphenyl lead is pyrolytically decomposed into lead atoms, which are intercalated into graphite layers.

Upon refinement through vacuum distillation, benzene is initially accommodated in a raw material receptacle 1. Upon operation of cocks 4, benzene molecules vaporized from the raw material receptacle 1 are led to a pyrex glass tube 2 and to a quartz reaction tube 3. The amount of benzene molecules to be supplied is controlled by a glass capillary 5 disposed inside the glass tube 2. The glass tube 2 is connected to a chamber 6, in which tetraphenyl lead is accommodated. Accordingly, the benzene molecules and the tetraphenyl lead are mixed with each other in the glass tube 2 and supplied to the reaction tube 3. Both the glass tube 2 and the chamber 6 are covered with and protected by a heating tape 7 and the tetraphenyl lead accommodated therein is vaporized by heating them up to a temperature of 350° C. The glass tube 2 and the reaction tube 3 are connected with each other via a pyrex-quartz conversion joint 8. The reaction tube 3 is inserted into a heating furnace 9 so as to be heated up to the reaction temperature. A substrate holder 10 is disposed inside the reaction tube 3 and a single-crystalline substrate for making the carbon deposit grow up is placed on the substrate holder 10. The remaining vapor led to the reaction tube 3 is discharged outside through a discharge pipe 11.

Upon operation of the heating furnace 9, the inside of the reaction tube 3 is kept at a temperature of 1000° C. Benzene molecules, the amount of supply of which is controlled by the capillary 5, and tetraphenyl lead molecules are led into the reaction tube 3 at a constant rate below several millimols in total per an hour. The benzene molecules led into the reaction tube 3 are pyrolytically decomposed and the carbon deposit having metallic luster are formed on the single-crystalline substrate. In this event, the tetraphenyl lead is also pyrolytically decomposed and lead atoms produced are intercalated between carbon deposit layers during the growing process of the carbon deposit. The carbon deposit obtained in this way is a carbon intercalation compound intercalated with lead atoms between carbon layers.

Evaluation

The thermoelectric power of the carbon intercalation compound in the direction perpendicular to the carbon layers was $\alpha = 50 \, \mu VK^{-1}$. This value is greater than the maximum value up to this time, which was ($\alpha = 40 \, \mu VK^{-1}$ and was a value of a graphite intercalation compound obtained by intercalating antimony pentachloride ($SbCl_5$) molecules.

The conductivity ($\sigma$) and the thermal conductivity ($\kappa$) were ($\sigma = 1300 \, \Omega^{-1}cm^{-1}$ and $\kappa = 1.8 \times 10^{-2} Wcm^{-1}K^{-1}$, respectively.

Substantially the same results were obtained by using tetra-tert-butyl-phthalocyaninate lead, etc., as well as tetraphenyl lead, as an organometallic compound of lead, which is used as a raw material for forming a carbon intercalation compound intercalated with lead between carbon layers.

(3) Carbon intercalation compound intercalated with bismuth between carbon layers Production (raw material: benzene and triphenyl bismuth)

Benzene is pyrolytically decomposed into carbon atoms, which accumulate as graphite whereas triphenyl bismuth is pyrolytically decomposed into bismuth atoms, which are intercalated into graphite layers.

Upon refinement through vacuum distillation, benzene is initially accommodated in a raw material receptacle 1. Upon operation of cocks 4, benzene molecules vaporized from the raw material receptacle 1 are led to a pyrex glass tube 2 and to a quartz reaction tube 3. The amount of benzene molecules to be supplied is controlled by a glass capillary 5 disposed inside the glass tube 2. The glass tube 2 is connected to a chamber 6, in which triphenyl bismuth is accommodated. Accordingly, the benzene molecules and the triphenyl bismuth are mixed with each other in the glass tube 2 and supplied to the reaction tube 3. Both the glass tube 2 and the chamber 6 are covered with and protected by a heating tape 7 and the triphenyl bismuth accommodated therein is vaporized by heating them up to a temperature of 280° C. The glass tube 2 and the reaction tube 3 are connected with each other via a pyrex-quartz conversion joint 8. The reaction tube 3 is inserted into a heating furnace 9 so as to be heated up to the reaction temperature. A substrate holder 10 is disposed inside the reaction tube 3 and a single-crystalline substrate for making the carbon deposit grow up is placed on the substrate holder 10. The remaining vapor led to the reaction tube 3 is discharged outside through a discharge pipe 11.

Upon operation of the heating furnace 9, the inside of the reaction tube 3 is kept at a temperature of 1000° C. Benzene molecules, the amount of supply of which is controlled by the capillary 5, and triphenyl bismuth molecules are led into the reaction tube 3 at a constant rate below several millimols in total per an hour. The benzene molecules led into the reaction tube 3 are pyrolytically decomposed and the carbon deposit having metallic luster are formed on the single-crystalline substrate. In this event, the triphenyl bismuth is also pyrolytically decomposed and bismuth atoms produced are intercalated between carbon deposit layers during the growing process of the carbon deposit. The carbon deposit obtained in this way is a carbon intercalation compound intercalated with bismuth atoms between carbon layers.

Evaluation

The thermoelectric power of the carbon intercalation compound in the direction perpendicular to the carbon layers was $\alpha = 150 \, \mu VK^{-1}$. This value is greater than the maximum value up to this time, which was $\alpha = 40 \, \mu VK^{-1}$ and was a value of a graphite intercalation compound obtained by intercalating antimony pentachloride ($SbCl_5$) molecules.

The conductivity ($\sigma$) and the thermal conductivity ($\kappa$) were ($\sigma = 1900 \, \Omega^{-1}cm^{-1}$ and $\kappa = 1.1 \times 10^{-2} Wcm^{-1}K^{-1}$, respectively.

Substantially the same results were obtained by using bismuth trichloride, etc., as well as triphenyl bismuth, as an organometallic compound of bismuth, which is used as a raw material for forming a carbon intercalation compound intercalated with bismuth between carbon layers.

(4) Carbon intercalation compound intercalated with antimony between carbon layers Production (raw material: benzene and triphenyl antimony)

Benzene is pyrolytically decomposed into carbon atoms, which accumulate as graphite whereas triphenyl antimony is pyrolytically decomposed into antimony atoms, which are intercalated into graphite layers.

Upon refinement through vacuum distillation, benzene is initially accommodated in a raw material receptacle 1. Upon operation of cocks 4, benzene molecules vaporized from the raw material receptacle 1 are led to a pyrex glass tube 2 and to a quartz reaction tube 3. The amount of benzene molecules to be supplied is controlled by a glass capillary 5 disposed inside the glass tube 2. The glass tube 2 is connected to a chamber 6, in which triphenyl antimony is accommodated. Accordingly, the benzene molecules and the triphenyl antimony are mixed with each other in the glass tube 2 and supplied to the reaction tube 3. Both the glass tube 2 and the chamber 6 are covered with and protected by a heating tape 7 and the triphenyl antimony accommodated therein is vaporized by heating them up to a temperature of 250° C. The glass tube 2 and the reaction tube 3 are connected with each other via a pyrex-quartz conversion joint 8. The reaction tube 3 is inserted into a heating furnace 9 so as to be heated up to the reaction temperature. A substrate holder 10 is disposed inside the reaction tube 3 and a single-crystalline substrate for making the carbon deposit grow up is placed on the substrate holder 10. The remaining vapor led to the reaction tube 3 is discharged outside through a discharge pipe 11.

Upon operation of the heating furnace 9, the inside of the reaction tube 3 is kept at a temperature of 1000° C. Benzene molecules, the amount of supply of is controlled by the capillary 5, and triphenyl antimony molecules are led into the reaction tube 3 at a constant rate below several millimols in total per an hour. The benzene molecules led into the reaction tube 3 are pyrolytically decomposed and the carbon deposit having metallic luster are formed on the single-crystalline substrate. In this event, the triphenyl antimony is also pyrolytically decomposed and antimony atoms produced are intercalated between carbon deposit layers during the growing process of the carbon deposit. The carbon deposit obtained in this way is a carbon intercalation compound intercalated with antimony atoms between carbon layers.

The thermoelectric power of the carbon intercalation compound in the direction perpendicular to the carbon layers was $\alpha = 120 \; \mu VK^{-1}$. This value is greater than the maximum value up to this time, which was $\alpha = 40 \; \mu VK^{-1}$ and was a value of a graphite intercalation compound obtained by intercalating antimony pentachloride ($SbCl_5$) molecules.

The conductivity ($\sigma$) and the thermal conductivity ($\kappa$) were $\sigma = 2200 \; \Omega^{-1}cm^{-1}$ and $\kappa = 1.1 \times 10^{-2} Wcm^{-1}K^{-1}$, respectively.

Substantially the same results were obtained by using antimony trichloride, antimony pentachloride, antimony tribromide, etc., as well as triphenyl antimony, as an organometallic compound of antimony, which is used as a raw material for forming a carbon intercalation compound intercalated with antimony between carbon layers.

(5) Carbon intercalation compound intercalated with mercury between carbon layers Production (raw material: benzene and diethyl mercury)

Benzene is pyrolytically decomposed into carbon atoms, which accumulate as graphite whereas diethyl mercury is pyrolytically decomposed into mercury atoms, which are intercalated into graphite layers.

Upon refinement through vacuum distillation, benzene is initially accommodated in a raw material receptacle 1. Upon operation of cocks 4, benzene molecules vaporized from the raw material receptacle 1 are led to a pyrex glass tube 2 and to a quartz reaction tube 3. The amount of benzene molecules to be supplied is controlled by a glass capillary 5 disposed inside the glass tube 2. The glass tube 2 is connected to a chamber 6, in which diethyl mercury is accommodated. Accordingly, the benzene molecules and the diethyl mercury are mixed with each other in the glass tube 2 and supplied to the reaction tube 3. Both the glass tube 2 and the chamber 6 are covered with and protected by a heating tape 7 and the diethyl mercury accommodated therein is vaporized by heating them up to a temperature of 150° C. The glass tube 2 and the reaction temperature of 150° C. The glass tube 2 and the reaction tube 3 are connected with each other via a pyrex-quartz conversion joint 8. The reaction tube 3 is inserted into a heating furnace 9 so as to be heated up to the reaction temperature. A substrate holder 10 is disposed inside the reaction tube 3 and a single-crystalline substrate for making the carbon deposit grow up is placed on the substrate holder 10. The remaining vapor led to the reaction tube 3 is discharged outside through a discharge pipe 11.

Upon operation of the heating furnace 9, the inside of the reaction tube 3 is kept at a temperature of 1000° C. Benzene molecules, the amount of supply of which is controlled by the capillary 5, and diethyl mercury molecules are led into the reaction tube 3 at a constant rate below several millimols in total per an hour. The benzene molecules led into the reaction tube 3 are pyrolytically decomposed and the carbon deposit having metallic luster are formed on the single-crystalline substrate. In this event, the diethyl mercury is also pyrolytically decomposed and mercury atoms produced are intercalated between carbon deposit layers during the growing process of the carbon deposit. The carbon deposit obtained in this way is a carbon intercalation compound intercalated with mercury atoms between carbon layers.

Evaluation

The thermoelectric power of the carbon intercalation compound in the direction perpendicular to the carbon layers was $\alpha = 60 \; \mu VK^{-1}$. This value is greater than the maximum value up to this time, which was $\alpha = 40 \; \mu VK^{-1}$ and was a value of a graphite intercalation compound obtained by intercalating antimony pentachloride ($SbCl_5$) molecules.

The conductivity ($\sigma$) and the thermal conductivity ($\kappa$) were $\sigma = 5100 \; \Omega^{-1}cm^{-1}$ and $\kappa = 2.1 \times 10^{-2} Wcm^{-1}K^{-1}$, respectively.

Substantially the same results were obtained by using diethyl mercury, mercury monochloride, mercury used as a raw material for forming a carbon intercalation compound intercalated with mercury between carbon layers.

As is seen from the foregoing description, by the converting method between heat energy and electric energy which utilizes the anisotropy of the carbon intercalation compound, the figure of merit of the thermoelectric material which is more than 100 times larger than the conventional number can be obtained, and a considerably desirable effect can be expected in case of thermoelectric generation or thermoelectric cooling.

Subsequently, a method for producing a light-heat converting material will be explained hereinafter.

Figure 2:
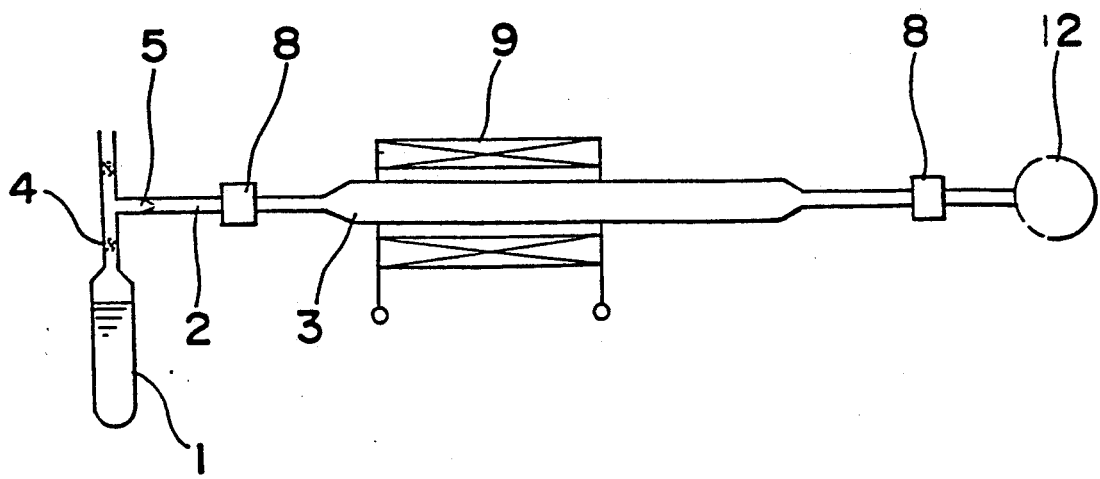
FIG. 2 is a block diagram of an apparatus for producing a light-heat converting material according to another preferred embodiment of the present invention.

FIG. 2 is an apparatus for producing a light-heat converting material according to one preferred embodiment of the present invention.

A hydrocarbon such as benzene, anthracene, n-hexane, cyclohexane, biphenyl, acetylene, etc., or a heterocyclic compound like pyridine is used as a starting material for forming a thin carbon layer which turns to be a light-heat converting film.

Hereupon, pyridine is selected as a starting material and the evaporating method is employed for producing the light-heat converting material in this embodiment. Furthermore, the process which overlaps with that in the method for producing the thermoelectric material will be also described for easy understanding.

Pyridine purified through vacuum distillation is evaporated from a raw material receptacle 1 wherein pyridine is accommodated and thereafter, pyridine molecules are led into a quartz glass reaction tube 3 from one end thereof through a supply tube 2 made of pyrex glass or the like. A cock 4 is arranged on the outlet side of the raw material receptacle 1 and a glass capillary 5 is provided on the supply tube 2. A required amount of pyridine is replenished through an inlet tube which is arranged above the raw material receptacle 1. The glass capillary 5 plays the role to maintain a supply rate of pyridine molecules to the reaction tube 3 approximately below several millimols an hour and also to prevent pyridine molecules from being supplied in a decreased amount accompanying temperature drop of the pyridine receptacle 1 due to evaporation of pyridine molecules. The reaction tube 3 is inserted into a movable type heating furnace 9 so as to be heated up to the reaction temperature. Thermal expansion of the reaction tube 3 is absorbed at pyrex-quartz conversion joints 8 arranged on the supply tube 2. The other end of the reaction tube 3 is connected to an exhaust system 12 so that the gas inside thereof is discharged to the exhaust system 12.

Inside of the reaction tube 3 is first maintained at the reaction temperature of approximately 950° C. by the heating furnace 9 and the capillary 5 is adjusted so as to control the supply rate of pyridine molecules which are led into the reaction tube 3 to be several millimols an hour. Pyridine molecules led into the reaction tube 3 are pyrolytically decomposed at the above described temperature and a carbon accumulated layer is caused to adhere firmly to inner surface of the reaction tube 3. The carbon accumulated layer is even in thickness and turns to have a smooth surface with metallic luster which is one of the characteristics the translucent mirror has. The carbon layer having a thickness of 0.05 to 0.13 micrometer, preferably, 0.08 micrometer is superior in light-heat conversion performance. When the heating furnace 9 is moved along the reaction tube 3, a thin carbon layer can be formed on all over the inner surface of the reaction tube 3, even if it has a long length. Upon removal of the quartz reaction tube 3 to which the thin carbon layer is caused to adhere firmly, when a fluid is let flow into the hollow reaction tube 3 having a light transmissive characteristic and the sunlight or the like is applied thereto, the fluid is heated up under the influence of light-heat conversion effect through the thin carbon layer and the temperature of the fluid goes up as the fluid flows in the reaction tube 3.

Electric power required for maintaining the reaction tube 3 at the reaction temperature of 950° C. is decreased by 30%, when the reaction tube 3 having the thin carbon film formed on the inner surface thereof is used, as compared with that without the thin carbon film. This means that heat-light conversion performance is improved by 30% due to the fact that the thin carbon layer like a translucent mirror is caused to adhere firmly to the inner surface of the quartz reaction tube 3. The thin carbon film has a favorable surface condition and is caused to adhere firmly to the inner surface of the reaction tube 3, free from being peeled off and the like problem.

It is to be noted here that the reaction temperature in the reaction tube 3 should be below 1000° C., because the carbon layer with a fairly uneven surface is undesirably obtained at a temperature over 1100° C. and accordingly, it is difficult to obtain the thin carbon film like a translucent mirror.

According to the above described embodiment of the present invention, since it is possible to firmly cover the inner surface of the hollow tube having optional figures with the thin carbon film like a translucent mirror, a converting efficiency between light energy and heat energy can be considerably increased.

It is also to be noted that although the evaporating method has been explained in the above described embodiments as a method for producing the thermoelectric or light-heat converting material, the present invention is not limited by this method and various kinds of liquid transfer methods in which the flow amount can be relatively precisely adjusted can be employed for the same purpose, for example, a bubbling method in which raw material liquid is bubbled by injecting inert gas such as argon gas or the like into a raw material such as hydrocarbon or the like and thereby raw material molecules are led into the reaction tube 3 together with the inert gas, or a sublimation method in which raw material is sublimated so that the vapor thereof is transferred, can be employed for producing the thermoelectric or light-heat converting material.

One of the above described methods can be properly selected in accordance with a melting point or a boiling point of the hydrocarbon to be used.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as being included therein.

What is claimed is:

1. A material for converting heat energy to electric energy consisting essentially of:
   graphite layers having atoms of a heavy metal intercalated between the adjoining graphite layers, said heavy metal being an element selected from the group consisting of bismuth, lead, antimony, tin and mercury, wherein the thermoelectric power of the intercalated heavy metal atoms in the direction perpendicular to the graphite layers of said material is $\alpha = 150\text{-}50\ \mu\text{VK}^{-1}$ and the conductivity and the thermal conductivity of said material are $\sigma = 5100\text{-}1200\ \Omega^{-1}\text{cm}^{-1}$ and $\kappa = 1.1\text{-}2.1 \times 10^{-2} \text{W}\cdot\text{cm}^{-1}\cdot\text{K}^{-1}$, respectively.

2. The material according to claim 1, wherein said heavy metal is an element selected from the group consisting of bismuth and antimony.

3. A material produced by simultaneously introducing a hydrocarbon or 1,2-dibromoethylene and an organometal reagent, in which the metal comprised therein is a heavy metal, into a reaction tube at the rate of a predetermined amount per hour and by pyrolytically decomposing said hydrocarbon compound or 1,2-dibromoethylene and said organometal reagent at a temperature of approximately 1000° C. and for converting heat energy to electric energy consisting essentially of:

graphite layers having atoms of a heavy metal intercalated between the adjoining graphite layers, said heavy metal being an element selected from the group consisting of bismuth, lead, antimony, tin and mercury, wherein the thermoelectric power of the intercalated heavy metal atoms in the direction perpendicular to the graphite layers of said material is $\alpha = 150\text{-}50\ \mu\text{V}^{-1}$ and the conductivity and the thermal conductivity of said material are $\sigma = 5100\text{-}1200\ \Omega^{-1}\text{cm}^{-1}$ and $\kappa = 1.1\text{-}2.1 \times 10^{-2} \text{W}\cdot\text{cm}^{-1}\cdot\text{K}^{-1}$, respectively.

* * * * *